United States Patent
Moon et al.

(10) Patent No.: US 9,217,935 B2
(45) Date of Patent: Dec. 22, 2015

(54) METHOD FOR FABRICATING A POROUS CARBON STRUCTURE USING OPTICAL INTERFERENCE LITHOGRAPHY, AND POROUS CARBON STRUCTURE FABRICATED BY SAME

(75) Inventors: Jun Hyuk Moon, Seoul (KR); Woo Min Jin, Busan (KR); Juhwan Shin, Seoul (KR)

(73) Assignee: Industry-University Cooperation Foundation Sogang University, Seoul (KR)

( * ) Notice: Subject to any disclaimer, the term of this patent is extended or adjusted under 35 U.S.C. 154(b) by 632 days.

(21) Appl. No.: 13/575,292

(22) PCT Filed: Apr. 15, 2010

(86) PCT No.: PCT/KR2010/002359
§ 371 (c)(1),
(2), (4) Date: Oct. 9, 2012

(87) PCT Pub. No.: WO2011/090233
PCT Pub. Date: Jul. 28, 2011

(65) Prior Publication Data
US 2013/0029130 A1 Jan. 31, 2013

(30) Foreign Application Priority Data
Jan. 25, 2010 (KR) .................. 10-2010-0006672

(51) Int. Cl.
*G03H 1/02* (2006.01)
*G03F 7/20* (2006.01)
(Continued)

(52) U.S. Cl.
CPC ............ *G03F 7/70408* (2013.01); *G03F 7/405* (2013.01); *G03F 7/70383* (2013.01); *G03H 2001/0441* (2013.01); *Y10T 428/249967* (2015.04)

(58) Field of Classification Search
CPC . G03F 7/70408; G03F 7/405; G03F 7/70383; G03H 2001/0441; Y10T 428/249967
See application file for complete search history.

(56) References Cited

U.S. PATENT DOCUMENTS

| 6,024,899 A | 2/2000 | Peng et al. |
| 7,264,990 B2 | 9/2007 | Rueckes et al. |

(Continued)

FOREIGN PATENT DOCUMENTS

WO 2008/141971 * 11/2008

OTHER PUBLICATIONS

Burckel et al. "Lithographically defined porous carbon electrodes", Small 5(24) pp. 2792-2796 (Oct. 2009).*

(Continued)

*Primary Examiner* — Martin Angebranndt
(74) *Attorney, Agent, or Firm* — Brundidge & Stanger, P.C.

(57) ABSTRACT

Provided are a method for fabricating a porous carbon structure using optical interference lithography, and a porous carbon structure fabricated by same, wherein the method for fabricating a porous carbon structure using optical light interference lithography includes: forming a photoresist layer on a substrate; irradiating a three-dimensional optical interference pattern onto the photoresist formed using three-dimensional optical interference lithography to form a three-dimensional porous photoresist pattern; coating the formed three-dimensional porous photoresist pattern with an inorganic material; heating the photoresist pattern on which the inorganic material is coated to carbonize the pattern; and removing the coated inorganic material.

7 Claims, 6 Drawing Sheets

(51) Int. Cl.
*G03F 7/40* (2006.01)
*G03H 1/04* (2006.01)

(56) References Cited

U.S. PATENT DOCUMENTS

| | | | |
|---|---|---|---|
| 7,335,395 B2 | 2/2008 | Ward | |
| 2001/0019037 A1* | 9/2001 | Zakhidov et al. | 216/56 |
| 2003/0108785 A1* | 6/2003 | Wu et al. | 429/44 |
| 2007/0248760 A1 | 10/2007 | Chmelka | |
| 2007/0289334 A1* | 12/2007 | Tetreault et al. | 65/391 |

OTHER PUBLICATIONS

Moon et al. "Core-shell diamond like silicon photonic crystals from 3D polymers templates created by holographic lithography", Opt. Exp. vol. 14(13) pp. 6297-6302 (Jun. 2006).*

Yan et al., "Line defects embedded in three dimensional photonic crystals", Adv. Mater. 17 pp. 1917-1920 (2005).*

Su et al. "Synthesis of graphitic ordered macroporous carbon with a Three-Dimensional interconnected pore structure for electrochemical applications", J. Phys. Chem., vol. 109(43) pp. 20200-20206 (Oct. 2005).*

Chanda et al. "Flexible Fabrication of three dimensional optical domain photonic crystals using a combination of single laser exposure diffractive optics lithography and template inversion" Opt. Lett., Voll 34(24) pp. 3920-3922 (Dec. 2009).*

Meisel et al. Three dimensional photonic crystals, Sol. Stat. Phenom., vol. 99-100 pp. 55-64 (2004).*

International Search Report from International Application No. PCT/KR2010/002359 mailed Feb. 24, 2011.

\* cited by examiner

METHOD FOR FABRICATING A POROUS CARBON STRUCTURE USING OPTICAL INTERFERENCE LITHOGRAPHY, AND POROUS CARBON STRUCTURE FABRICATED BY SAME

TECHNICAL FIELD

The present disclosure relates to a method for fabricating a porous carbon structure using optical interference lithography, and a porous carbon structure fabricated by the method, in particular, to a method for fabricating a porous carbon structure by carbonizing a photoresist pattern formed using three-dimensional optical interference lithography to form a porous carbon structure, and a porous carbon structure fabricated by the method.

BACKGROUND ART

Pores of porous materials are classified into three types of pores, i.e., micropores (<2 nm), mezzo pores (2~50 nm), and macro pores (>50 nm). Since porous materials can be used in various fields including catalysts, separation systems, low dielectric materials, hydrogen storage materials, and photonic crystal through control of their pore sizes, the materials have received much attention recently.

As such porous materials, there are materials containing inorganic materials, metals, polymers, carbons, or others. Among the materials, porous materials containing carbons (porous carbon structures) have excellent chemical, mechanical, and thermal stability, and can be effectively used in various fields. In particular, with surface characteristics, ion conductivity, corrosion resistance, and low costs, the porous carbon materials have been deemed to be important materials for low temperature polymer electrolyte membrane fuel cells. Various types and shapes of carbon materials have been used. High surface area activated carbons, carbon blacks, and others have been used as supporting materials to fabricate a metal catalyst.

The fabrication of the porous carbon structure has been achieved through a templating method. Conventionally, the porous carbon structure has been fabricated by applying a method of injecting a carbon precursor into a silica structure having mezzo pores synthesized by using a mixture of a surfactant and a silica precursor, carbonizing the carbon precursor, and then, selectively removing the silica structure, or a method of forming a three-dimensional porous structure through self-assembling of nano particles, and not, the surfactant, injecting a carbon precursor thereinto to carbonize the carbon precursor, and then, removing the nano particle assembly.

However, there have been difficulties in synthesizing a carbon material having a high surface area and thoroughly interconnected and uniformed porous structure. In particular, the size of pores of the porous carbon structure cannot be freely controlled. Also, it takes much time to generate the carbon structure.

Thus, in forming a porous carbon structure having homogenous fine pores three-dimensionally connected to one another and regularly arranged, there has been the need for a technology enabling accurate control of a pore size and rapid formation of the carbon structure.

DISCLOSURE OF THE INVENTION

Problems to be Solved by the Invention

An illustrative embodiment of the present disclosure provides a method for fabricating a porous carbon structure using optical interference lithography, including forming a photoresist pattern having a three-dimensional pore structure through an optical interference lithography process, and carbonizing the formed photoresist pattern, and a porous carbon structure fabricated by the method.

An illustrative embodiment of the present disclosure provides a method for fabricating a porous carbon structure using optical interference lithography, enabling precise control of various shapes of pores depending on intensity of coherent light to be irradiated and an irradiation condition, and a porous carbon structure fabricated by the method.

An illustrative embodiment of the present disclosure provides a method for fabricating a porous carbon structure using optical interference lithography, including coating the formed photoresist pattern with an inorganic material, and heating the coated photoresist pattern to carbonize the photoresist pattern, and a porous carbon structure fabricated by the method.

However, problems sought to be resolved by the present disclosure are not limited to the above-described problems. Other problems, which are sought to be resolved by the present disclosure but are not described herein, can be clearly understood by those skilled in the art from the descriptions below.

Means for Solving the Problems

As technical means to solve the above-described problems, a first aspect of the present disclosure provides a method for fabricating a porous carbon structure using optical interference lithography, including: forming a photoresist layer on a substrate; irradiating a three-dimensional optical interference pattern onto the formed photoresist layer by using three-dimensional optical interference lithography to form a three-dimensional porous photoresist pattern; coating the formed three-dimensional porous photoresist pattern with an inorganic material; heating the photoresist pattern coated with the inorganic material to carbonize the photoresist pattern; and removing the coated inorganic material to obtain a porous carbon structure.

In an illustrative embodiment, the step of irradiating a three-dimensional optical interference pattern to form the three-dimensional porous photoresist pattern may further include developing the photoresist layer, to which the three-dimensional optical interference pattern is irradiated, after irradiating the three-dimensional optical interference pattern onto the photoresist by using three-dimensional optical interference lithography. However, the present disclosure is not limited thereto.

In an illustrative embodiment, the three-dimensional optical interference pattern may be formed by fixing a polyhedral prism on the photoresist layer and irradiating an ultraviolet (UV) ray. However, the present disclosure is not limited thereto. For example, the three-dimensional optical interference pattern may be formed by fixing a polyhedral prism on the photoresist layer and irradiating an ultraviolet (UV) ray to interfere multiple parallel lights. However, the present disclosure is not limited thereto.

In an illustrative embodiment, the three-dimensional optical interference pattern may be formed by irradiating 4 coherent parallel lights having optical path differences on the photoresist layer. However, the present disclosure is not limited thereto. For example, a lattice constant of the three-dimensional photoresist pattern to be formed can be adjusted by adjusting an incident angle of the coherent parallel lights to be irradiated. For example, a pore size of the three-dimensional porous photoresist pattern to be formed can be adjusted by adjusting intensity and irradiation time of the coherent parallel lights to be irradiated.

In an illustrative embodiment, the three-dimensional porous photoresist pattern may be formed with a three-dimensional face-centered cubic structure, in which three-dimensional pores are regularly arranged on the photoresist layer. However, the present disclosure is not limited thereto.

In an illustrative embodiment, the step of coating the photoresist pattern with an inorganic material may include coating the photoresist pattern with an inorganic material by performing, at least one time, absorbing moisture onto the surface of the photoresist pattern followed by exposing the photoresist pattern to vapor containing an inorganic precursor, and removing the moisture through a sintering process. However, the present disclosure is not limited thereto.

In an illustrative embodiment, the inorganic material is selected from the group consisting of silica, titania, zirconia, alumina, and a combination thereof. However, the present disclosure is not limited thereto.

In an illustrative embodiment, the step of irradiating a three-dimensional optical interference pattern to form the three-dimensional porous photoresist pattern may include overlapping and irradiating at least two three-dimensional optical interference patterns having different frequencies onto the photoresist layer to form a multi-scale lattice pattern on the photoresist layer. However, the present disclosure is not limited thereto.

A second aspect of the present disclosure may provide a porous carbon structure fabricated by: forming a photoresist layer on a substrate; irradiating a three-dimensional optical interference pattern onto the formed photoresist layer using three-dimensional optical interference lithography to form a three-dimensional porous photoresist pattern; coating the formed three-dimensional porous photoresist pattern with an inorganic material; heating the photoresist pattern coated with the inorganic material to carbonize the photoresist pattern; and removing the coated inorganic material.

Effect of the Invention

In accordance with an illustrative embodiment of the present disclosure, a photoresist pattern having a three-dimensional porous structure is formed through an optical interference lithography process, and the formed photoresist pattern is carbonized, so that process time required to fabricate a porous carbon structure can be reduced.

In accordance with an illustrative embodiment of the present disclosure, various shapes of pores are precisely controlled depending on intensity of coherent lights to be irradiated and an irradiation condition, so that an optimized porous carbon structure can be fabricated.

In accordance with an illustrative embodiment of the present disclosure, the formed photoresist pattern is coated with the inorganic material, so that when the porous carbon structure is formed by carbonization through heating, transformation of the carbon structure can be minimized.

Such a porous carbon structure can be used as an electrode supporting material or a catalyst supporting material in various devices such as condensers and fuel cells and the like.

BEST MODE FOR CARRYING OUT THE INVENTION

Figure 1:
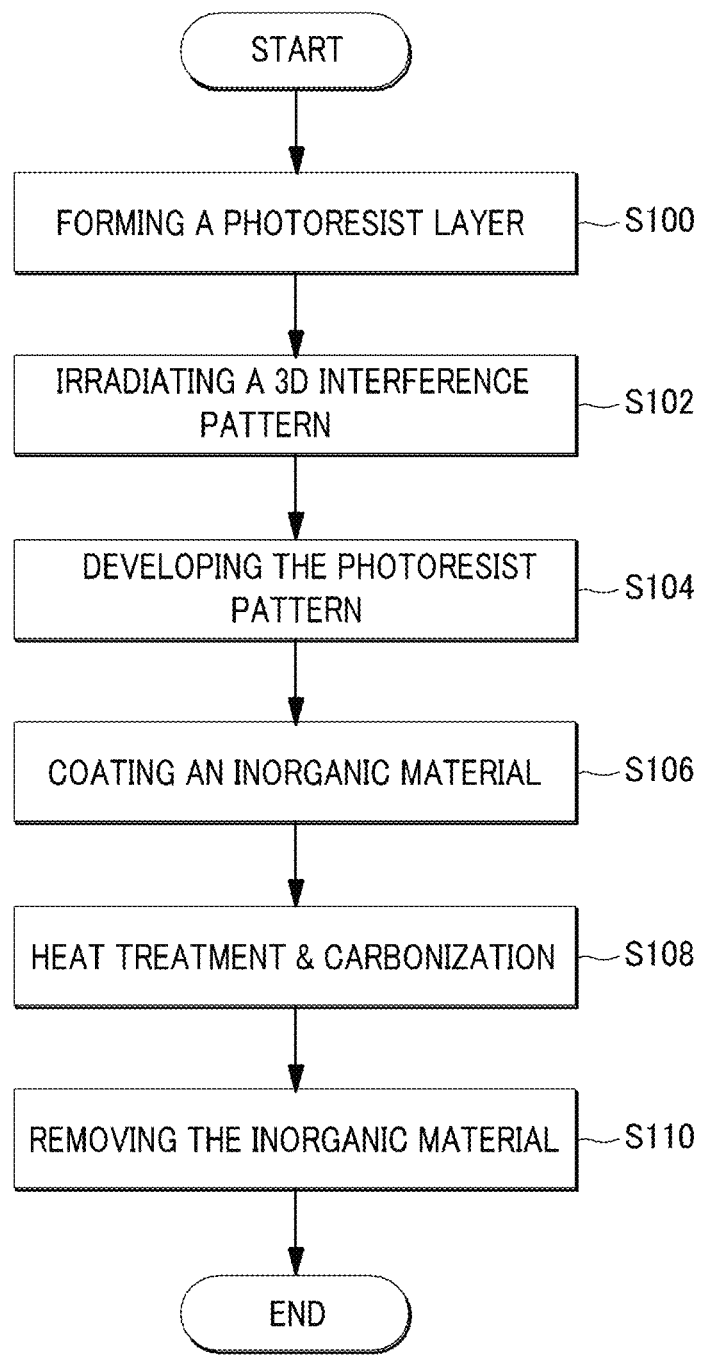
FIG. 1 is a detailed flow chart showing a method for fabricating a porous carbon structure using three-dimensional optical interference lithography in accordance with an illustrative embodiment of the present disclosure.

Hereinafter, illustrative embodiments of the present disclosure will be described in detail with reference to the accompanying drawings so that the present disclosure may be readily implemented by those skilled in the art. However, it is to be noted that the present disclosure is not limited to the illustrative embodiments and the examples, and can be realized in various other ways. In the drawings, parts irrelevant to the description are omitted for the simplicity of explanation. Throughout the whole document, like reference numerals denote like parts.

Throughout the whole document, the term "comprises or includes" and/or "comprising or including" used in the document means that one or more other components, steps, operation and/or existence or addition of elements are not excluded in addition to the described components, steps, operation and/or elements unless context dictates otherwise.

Hereinafter, the present disclosure will be described in detail with reference to the accompanying drawings.

FIG. 1 is a detailed flow chart showing a method for fabricating a porous carbon structure using three-dimensional optical interference lithography in accordance with an illustrative embodiment of the present disclosure.

S100 is a step of forming a photoresist layer on a substrate.

In S100, a photoresist layer can be formed on a substrate through various coating methods. For the photoresist, various polymers, which are cross-linked or changed in their chemical structures due to optical reaction so that solubility thereof is selectively changed, may be used. Any of a negative type of photoresist or a positive type of photoresist may be used. For example, SU-8, which is an epoxy-substrate negative pohotoresist as the negative type, may be used. The photoresist solution may be prepared by dissolving the SU-8 photoresist and an photo-initiator (PI, e.g., triarylsulfonium hexafluorophosphate salts) in γ-butyrolactone (GBL).

S102 is a step for irradiating a three-dimensional optical interference pattern on the photoresist layer.

In S102, a three-dimensional porous pattern can be formed on the photoresist layer through optical interference lithography by irradiating an optical interference pattern formed by using multiple coherent parallel lights, to which optical path differences are assigned. The optical interference pattern is a pattern, in which constructive interference and destructive interference are regularly repeated. If the optical interference pattern is irradiated on the photoresist, optical reaction is relatively proceeded only in the constructive interference region, and is not proceeded in the destructive interference region.

In S102, for example, the three-dimensional porous pattern can be formed by irradiating the three-dimensional optical interference pattern formed by using 4 coherent parallel lights on the photoresist layer. In this case, the 4 lights can be generated by applying a method of dividing one coherent parallel light into multiple lights, or irradiating one coherent parallel light to a polyhedral prism. For example, the three-dimensional optical interference pattern can be formed by using multiple parallel lights formed by fixing a polyhedral prism on the substrate coated with the photoresist, and then, irradiating a 300 to 400 nm UV light source.

In this case, the pattern formed on the photoresist layer may be a pattern, in which pores having a face-centered cubic structure are repeated. The pattern may be formed with various lattice structures by adjusting an angle and a direction of lights to be irradiated. Furthermore, a size of the pattern can be effectively adjusted by adjusting exposure time for irradiation and post-exposure baking for cross-linking of the coherent lights to be irradiated.

Further, in S102, at least two three-dimensional optical interference patterns having various frequencies may be overlapped and irradiated on the photoresist layer. In this case, a multi-scale lattice pattern can be formed on the photoresist layer.

S104 is a step of developing the photoresist pattern. In S104, the photoresist pattern can be formed by removing a certain portion of the photoresist layer using a developing solution. The certain portion of the photoresist layer may be an exposed photoresist area or an unexposed photoresist area depending photoresist to be used. In S104, for example, the photoresist pattern can be developed by immersing the substrate in propylene glycol methyl ether acetate (PGMEA) solution at 55° C. and cleaning the substrate with distilled water ($H_2O$) after the irradiation of the light source.

Figure 3:
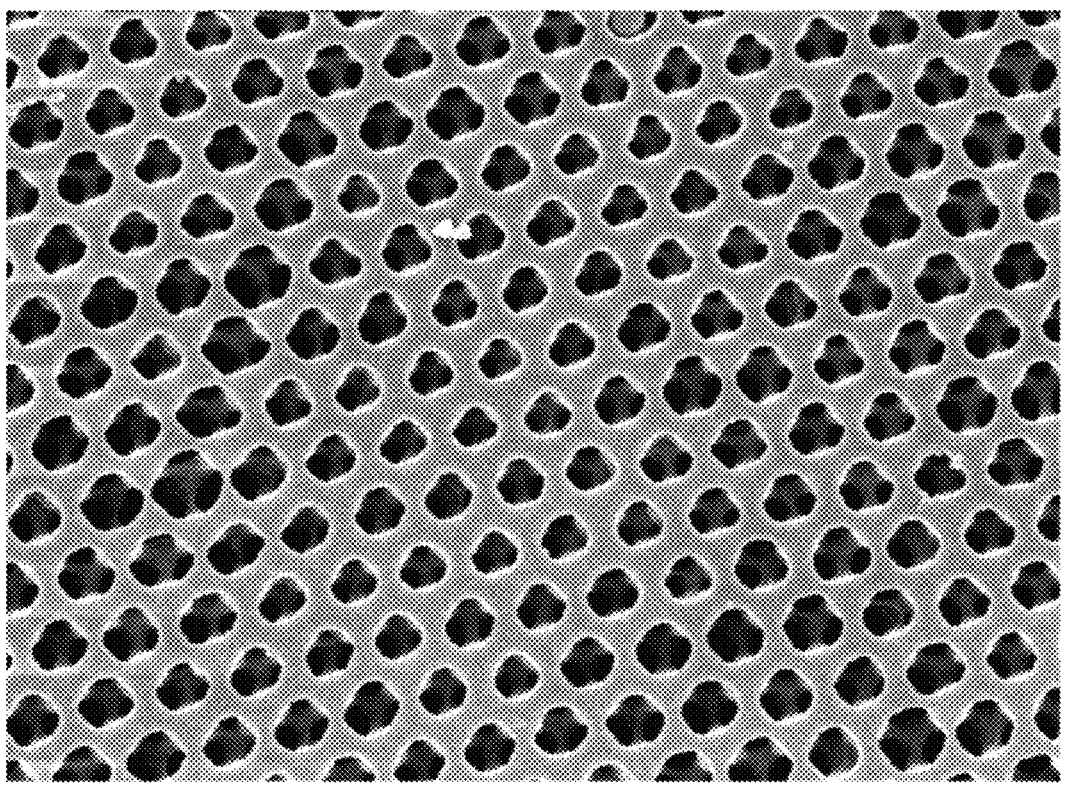
FIG. 3 is an electron micrograph of a three-dimensional porous photoresist pattern formed by using three-dimensional optical interference lithography in accordance with an illustrative embodiment of the present disclosure.

FIG. 3 shows an electron micrograph of the photoresist, on which the three-dimensional porous pattern formed through the optical interference lithography is formed, in accordance with an illustrative embodiment of the present disclosure.

S106 is a step of coating the photoresist porous pattern with an inorganic material.

In S106, in order to maintain the structure of the photoresist pattern when the photoresist pattern is carbonized, the formed photoresist porous pattern may be coated with an inorganic material. For example, the photoresist pattern may be coated with an inorganic material through a chemical vapor deposition (CVD) method using an inorganic material precursor. In this case, thickness of the inorganic material coating can be controlled depending on the time for the chemical vapor deposition process, and may be about 10 to about 200 nm. However, the present disclosure is not limited thereto. The inorganic material coating may include performing, at least one time, depositing the inorganic material precursor after moisture deposition. The deposition is preferably performed under a condition of vacuum or an atmospheric pressure. Specifically, absorbing moisture on the surface of the photoresist pattern, and then, exposing the photoresist pattern to steam containing the inorganic material precursor may be performed at least one time. The deposition process may further include a heating or sintering process. For example, if the inorganic material is a silica, thickness of silica coating may be controlled depending on the time for the chemical vapor deposition process, and may be about 10 to about 200 nm. However, the present disclosure is not limited thereto. The silica coating may include performing, at least one time, depositing a silica precursor after moisture deposition. The deposition is preferably performed under a condition of vacuum or an atmospheric pressure. For example, the formed photoresist porous pattern may be exposed to moisture so as to absorb the moisture to the surface of the photoresist porous pattern. After a few minutes, the photoresist porous pattern may be exposed to a silicon tetrachloride ($SiCl_4$) gas so as to react the moisture absorbed on the surface of the formed photoresist porous pattern and the precursor, so that a silica hydrate can be deposited. If this process is repeated several times, thick silica deposition can be achieved. The silica hydrate can be converted into silica by removing the moisture through a sintering process.

S108 is a step of carbonizing the photoresist pattern coated with the inorganic material as described above.

In S108, the photoresist part can be carbonized by heating the photoresist pattern coated with the inorganic material at a high temperature. The heating may be performed at different temperatures depending on types of photoresist. For example, the SU-8 photoresist pattern may be heated at more than about 500° C. to carbonize the photoresist.

For example, if the photoresist pattern coated with silica is heated, the coated silica maintains its shape during the carbonization of the photoresist. Accordingly, transformation of the structure of the photoresist porous pattern caused by the carbonization can be minimized, and destroy of the photoresist structure can be prevented.

S110 is a step for removing the coated inorganic material.

The coated inorganic material can be removed by using an acid solution and a deionized water.

For example, if the photoresist pattern is coated with silica, the coated silica can be removed by immersing the substrate, on which the photoresist porous pattern coated with silica is formed, in a hydrofluoric acid solution obtained by diluting a hydrofluoric acid in deionized water, taking the substrate from the solution, and cleaning the substrate with deionized water several times.

Figure 2:
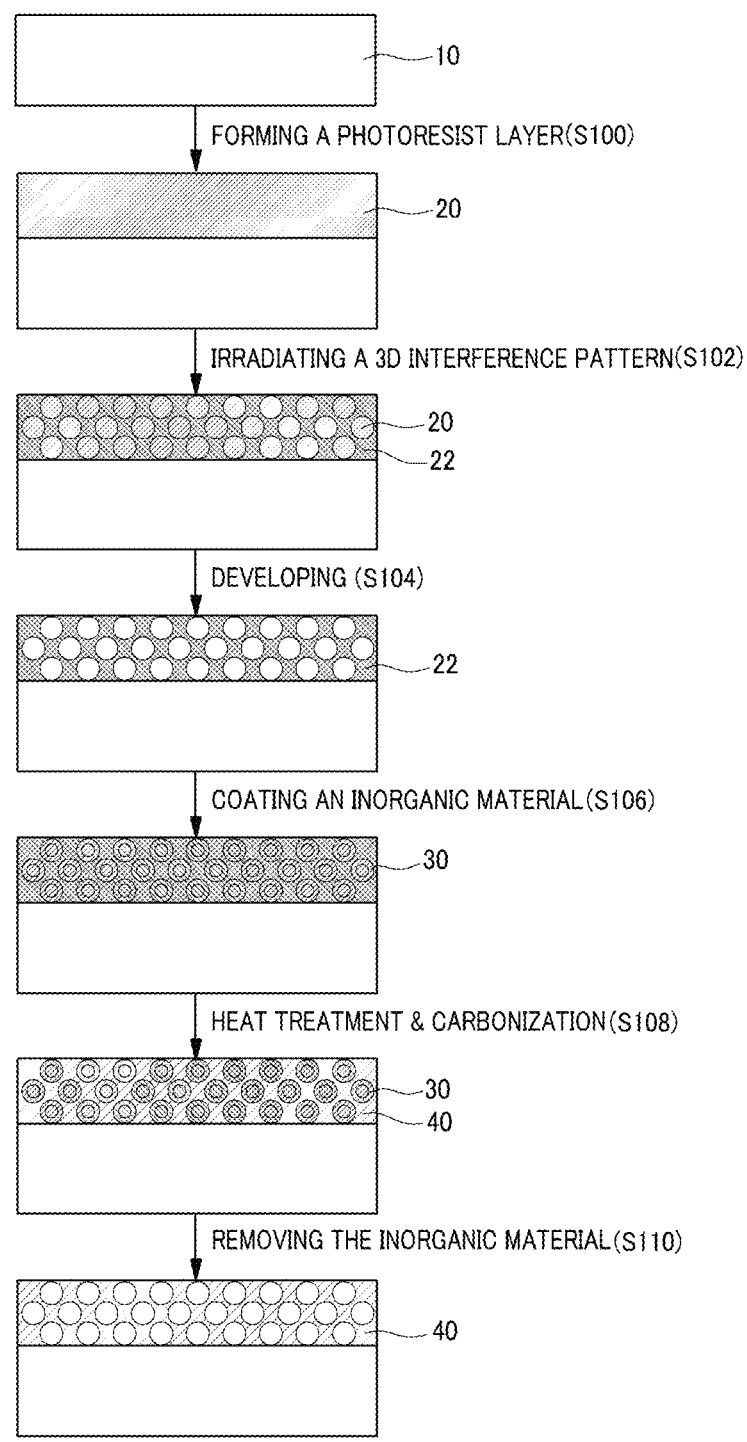
FIG. 2 is a diagram showing a process for fabricating a porous carbon structure using three-dimensional optical interference lithography in accordance with an illustrative embodiment of the present disclosure.

FIG. 2 is a diagram showing a process for fabricating a porous carbon structure using optical interference lithography in accordance with an illustrative embodiment of the present disclosure.

As illustrated in FIG. 2, a photoresist pattern can be formed by forming a photoresist layer 20 on a substrate 10, irradiating a three-dimensional optical interference pattern on the formed photoresist layer 20, and developing the pattern. Through the developing process, photoresist 22 exposed or unexposed to coherent parallel lights can be removed. Thereafter, the formed photoresist pattern is coated with an inorganic material 30. The photoresist pattern is heated and carbonized to form carbonized photoresist 40. The inorganic material 30 is removed so that a porous carbon structure 40 is formed.

FIG. 3 is an electron micrograph of a three-dimensional porous photoresist pattern formed by using three-dimensional optical interference lithography in accordance with an illustrative embodiment of the present disclosure.

As illustrated in FIG. 3, a three-dimensional porous pattern can be formed on the photoresist layer by irradiating an optical interference pattern formed of multiple coherent parallel lights, to which optical path differences are assigned. In this case, the multiple coherent parallel lights can be generated by applying a method of dividing one coherent parallel light into multiple lights, or irradiating one coherent parallel light on a polyhedral prism.

The photoresist pattern may have a face-centered cubic structure, in which pores are repeated. The photoresist pattern may be formed with various lattice structures by adjusting an angle and a direction of lights to be irradiated. A size of the pattern may be effectively adjusted by adjusting exposure time of coherent lights to be irradiated, post-exposure baking time, and the like.

For example, the porous photoresist pattern may be a pattern, in which pores in a spherical or cylindrical shape are arranged in a face-centered cubic structure. The pores may be interconnected via connected pores in the form of 6 pipes. A size of the pores and the interconnected pores can be freely controlled by varying the optical interference lithography condition.

EXAMPLE 1

As the photoresist, a negative type epoxy-based SU-8 photoresist was used. A photoresist solution was prepared by dissolving the SU-8 photoresist and a photo-initiator (PI, triarylsulfonium hexafluorophosphate salts) in γ-butyrolactone (GBL). The photoresist solution was coated on a substrate to form a photoresist layer.

Thereafter, a polyhedral prism was fixed on an upper part of the substrate, on which the photoresist layer was formed. Thereafter, a three-dimensional optical interference pattern formed by irradiating 300 nm to 400 nm of UV light source was irradiated to the photoresist layer so as to form a three-dimensional photoresist pattern. In this case, in order to form the three-dimensional photoresist pattern, an optical interference three-dimensional lithography technique was applied. A three-dimensional optical interference pattern formed by overlapping at least 4 coherent laser lights was irradiated so as to form a three-dimensional porous photoresist pattern structure.

The substrate, to which the three-dimensional optical interference pattern had been irradiated, was immersed in a propylene glycol methyl ether acetate (PGMEA) solution at 55° C. Thereafter, the substrate was cleaned with distilled water ($H_2O$) to develop the photoresist pattern, so that a three-dimensional porous SU-8 photoresist pattern was obtained.

Thereafter, the formed SU-8 photoresist porous pattern was coated with silica through a chemical vapor deposition (CVD) method. Specifically, the photoresist porous pattern was exposed to moisture so as to absorb the moisture to the photoresist porous pattern. After a few minutes, the photoresist porous pattern was exposed to a silicon tetrachloride ($SiCl_4$) gas as a silica precursor so as to react the moisture absorbed on the surface of the photoresist porous pattern with the silica precursor, so that a silica hydrate was deposited. This process was repeated several times, and the moisture was removed through a sintering process to convert the silica hydrate into silica, such that the photoresist porous pattern was coated with silica.

Thereafter, the photoresist pattern coated with silica was heated to carbonize the photoresist pattern. The carbonizing process was performed under an argon atmosphere. Specifically, the sintering process was performed under the argon atmosphere at 800° C. for 2 hours to carbonize the photoresist part of the photoresist pattern so that a porous carbon structure was obtained.

Figure 4:
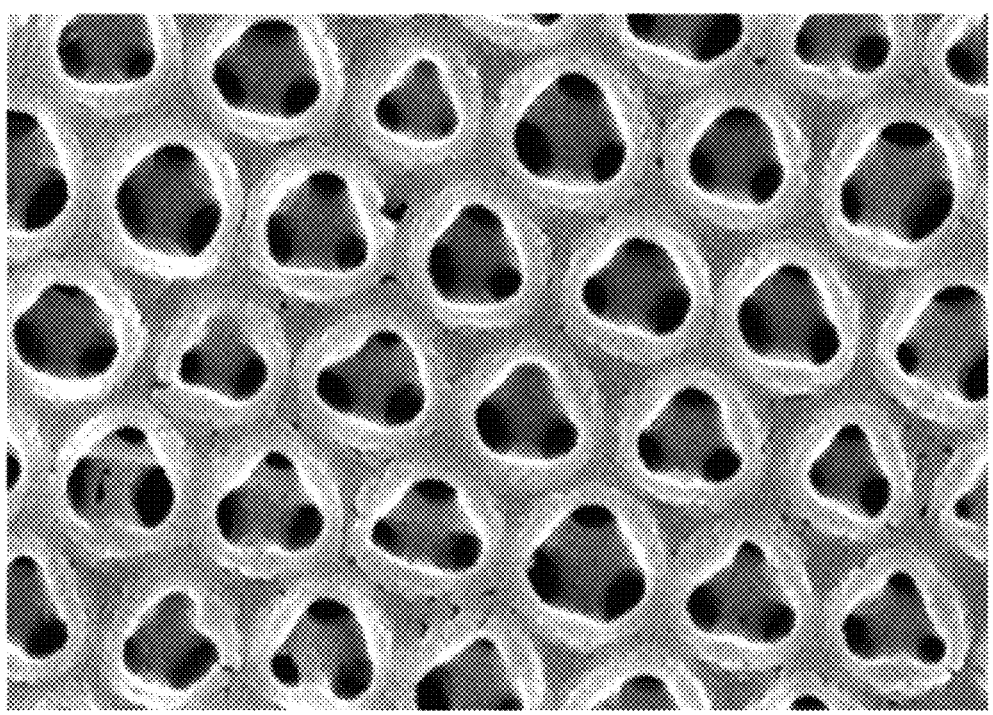
FIG. 4 is an electron micrograph after the three-dimensional porous photoresist pattern formed by using three-dimensional optical interference lithography is coated with an inorganic material and carbonized in accordance with an illustrative embodiment of the present disclosure.

FIG. 4 shows an electron micrograph of the three-dimensional porous photoresist pattern after the pattern formed by using three-dimensional optical lithography was coated with silica and carbonized in accordance with the present example.

Figure 5:
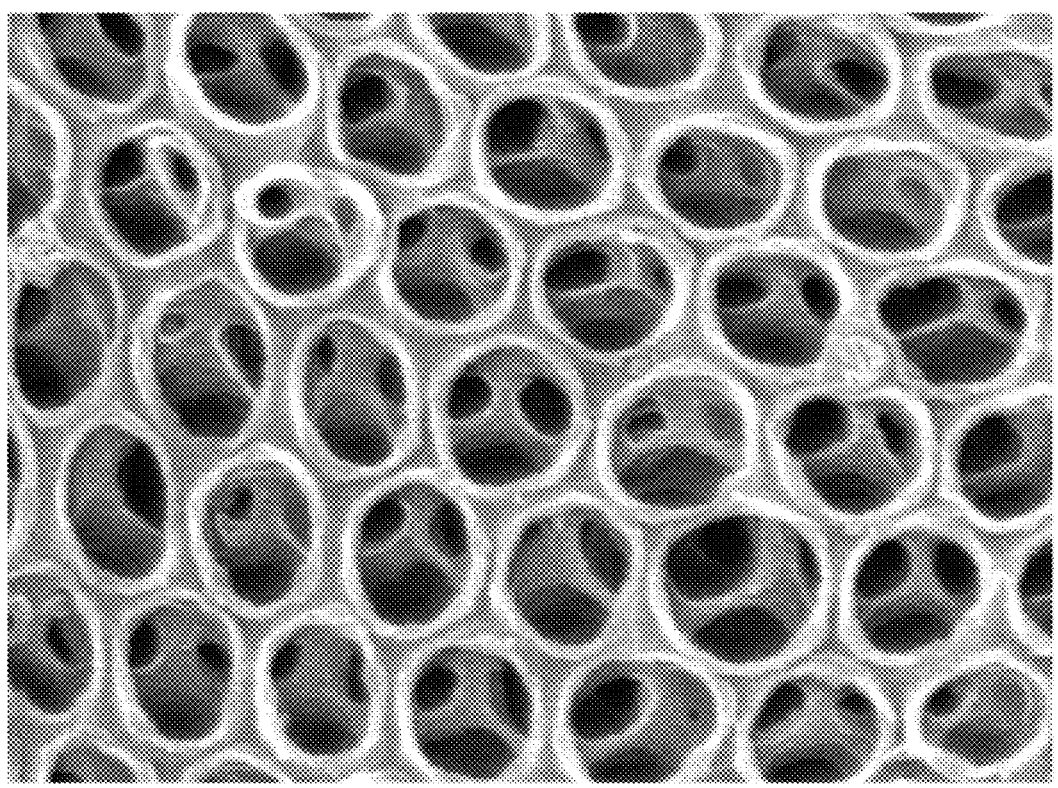
FIG. 5 is an electron micrograph of a porous carbon structure formed after the three-dimensional porous photoresist pattern is coated with an inorganic material and carbonized, and then, the coated inorganic material is removed in accordance with an illustrative embodiment of the present disclosure.

Thereafter, the silica coating was removed by using a hydro fluoric acid solution. The hydrofluoric acid was diluted in deionized distilled water. The substrate coated with silica was immersed in the diluted hydro fluoric acid solution, and then, cleaned with distilled water. FIG. 5 shows an electron micrograph of the porous carbon structure after the coated silica was removed via this process.

As shown in FIGS. 4 and 5, in the present example, the photoresist pattern was coated with the inorganic material prior to carbonizing the photoresist pattern. Thus, the structure of the photoresist pattern can be maintained when the photoresist pattern was carbonized.

TABLE 1

|  | C (%) | H (%) | N (%) | O (%) |
|---|---|---|---|---|
| SU-8 ($C_{19}H_{23}ClO_4$) photoresist | 96.9697 | 0.7062 | 0.4829 | 1.8412 |

Table 1 provides results of analysis of the photoresist sample carbonized at 800° C. in the present example through an element analyzer. The results show that more than 96% of the components of the photoresist sample are carbons. The results confirm that the carbonized photoresist pattern was mostly composed of carbon components.

The porous carbon structure obtained in the present example was coated with a Pt catalyst through an electroless deposition method.

Specifically, a certain amount of the formed porous carbon structure was dispersed in deionized distilled water. After $H_2PtCl_6.H_2O$ was added thereto, 3.0 M NaOH was applied to adjust pH to be 8. A $NaBH_4$ solution was gradually added while stirring the solution. A molar ratio of $H_2PtCl_6.H_2O$ and $NaBH_4$ was 1:10. The stirring was performed for one day to reduce all platinum ions. Thereafter, the structure was cleaned with a solution of ethanol and water with a molar ratio of 1:1. Subsequently, the structure was dried in a 70° C. oven so that a porous carbon structure coated with the Pt catalyst was obtained.

Figure 6:
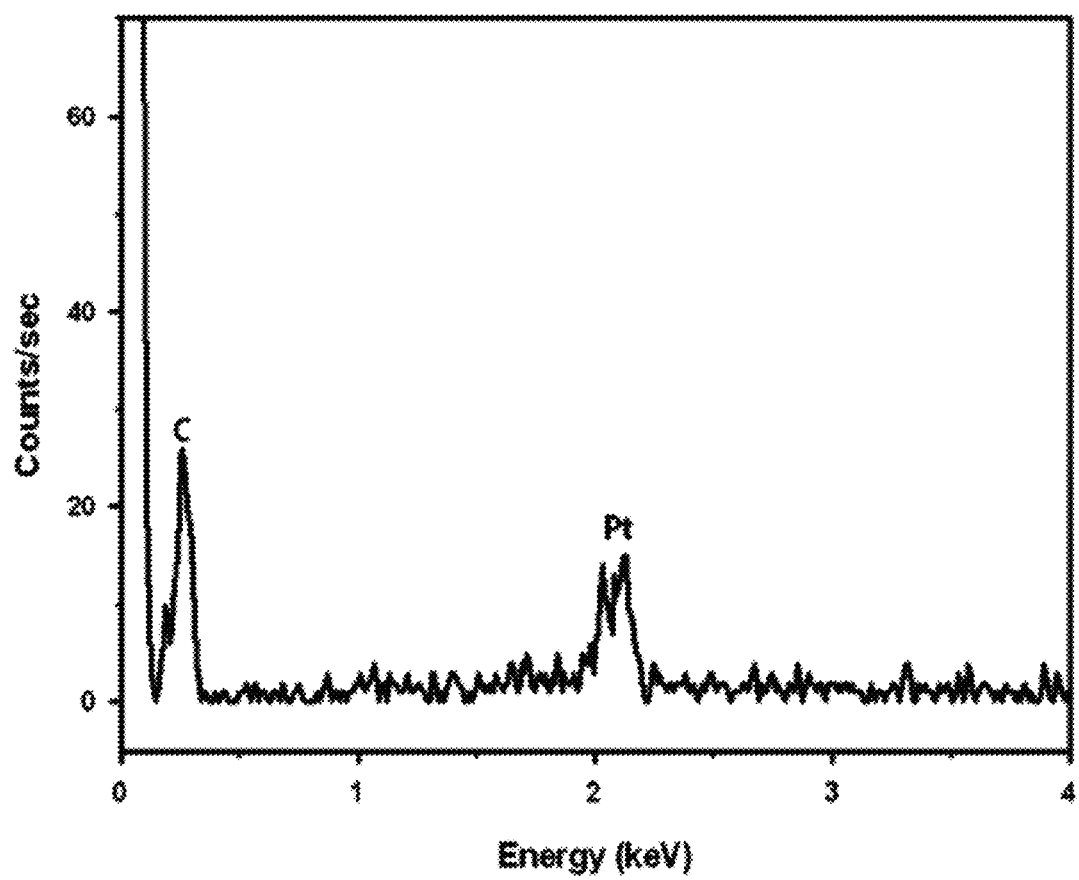
FIG. 6 is a surface element analysis graph measured after a Pt catalyst is immersed in a porous carbon structure formed in accordance with an illustrative embodiment of the present disclosure.

Thereafter, as shown in the element analysis graph of FIG. 6 and Table 2 providing amounts of carbons and platinum calculated therefrom, it was confirmed through surface analysis that the carbon structure can be applied as a catalyst supporting material that can be utilized in fuel cells or the like and immerse a large amount of Pt.

TABLE 2

| Elements | Carbon Structure |
|---|---|
| C | 52.60% |
| Pt | 47.4% |

The above description of the illustrative embodiments is provided for the purpose of illustration, and it would be understood by those skilled in the art that various changes and modifications may be made without changing technical conception and essential features of the illustrative embodiments. Thus, it is clear that the above-described illustrative embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the illustrative embodiments. It shall be understood that all modifications and embodiments conceived from the meaning and scope of the claims and their equivalents are included in the scope of the inventive concept.

What is claimed is:

1. A method for fabricating a porous carbon structure using optical interference lithography, the method comprising:
   forming a photoresist layer on a substrate;
   irradiating a three-dimensional optical interference pattern onto the formed photoresist layer by using three-dimensional optical interference lithography to form a three-dimensional porous photoresist pattern;
   developing the photoresist layer onto which the three-dimensional optical interference pattern is irradiated; and
   coating the formed three-dimensional porous photoresist pattern with a thin coating of about 10 nm to about 200 nm of an inorganic material,
   wherein the coating includes:
      at least once absorbing moisture onto the surface of the photoresist pattern,
      exposing the photoresist pattern to vapor containing an inorganic precursor, and
      performing a first heating of the photoresist pattern to remove the moisture;
      performing a second heating of the photoresist pattern coated with the inorganic material at a temperature of more than about 500° C. in an argon atmosphere to carbonize the photoresist pattern; and
      removing the coated inorganic material to obtain a porous carbon structure.

2. The method for fabricating a porous carbon structure using optical interference lithography of claim 1,
   wherein the three-dimensional optical interference pattern is formed by irradiating 4 coherent parallel lights having optical path differences onto the photoresist layer.

3. The method for fabricating a porous carbon structure using optical interference lithography of claim 2,
   wherein a lattice constant of the formed three-dimensional porous photoresist pattern is controlled depending on an incidence angle of the coherent parallel lights to be irradiated.

4. The method for fabricating a porous carbon structure using optical interference lithography of claim 2,
   wherein a pore size of the formed three-dimensional porous photoresist pattern is controlled depending on an intensity and an irradiation time of the coherent parallel lights to be irradiated.

5. The method for fabricating a porous carbon structure using optical interference lithography of claim 1,
   wherein the three-dimensional porous photoresist pattern is formed in a three-dimensional face-centered cubic structure in which three-dimensional pores are regularly arranged in the photoresist layer.

6. The method for fabricating a porous carbon structure using optical interference lithography of claim 1,
   wherein the inorganic material is selected from the group consisting of silica, titania, zirconia, alumina, and combinations thereof.

7. The method for fabricating a porous carbon structure using optical interference lithography of claim 1,
   wherein the step of irradiating the three-dimensional optical interference pattern to form the three-dimensional porous photoresist pattern includes overlapping and irradiating at least two three-dimensional optical interference patterns having different frequencies onto the photoresist layer to form a multiscale lattice pattern on the photoresist layer.

* * * * *